(12) United States Patent
Kalkowski et al.

(10) Patent No.: US 8,274,640 B2
(45) Date of Patent: Sep. 25, 2012

(54) FLEXIBLY DEFORMABLE HOLDING ELEMENT FOR SUBSTRATES

(75) Inventors: Gerhard Kalkowski, Jena (DE); Stefan Risse, Jena (DE); Thomas Peschel, Jena (DE); Christoph Damm, Jena (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 203 days.

(21) Appl. No.: 12/565,121

(22) Filed: Sep. 23, 2009

(65) Prior Publication Data
US 2010/0265485 A1  Oct. 21, 2010

(30) Foreign Application Priority Data
Oct. 8, 2008  (DE) .................... 10 2008 052 100

(51) Int. Cl.
*G03B 27/58* (2006.01)
*H01L 21/683* (2006.01)
(52) U.S. Cl. .................................. 355/72; 361/234
(58) Field of Classification Search ............ 355/53, 355/72–76; 361/234; 310/10, 12
See application file for complete search history.

(56) References Cited

U.S. PATENT DOCUMENTS

| 4,475,223 A | 10/1984 | Taniguchi et al. | |
|---|---|---|---|
| 4,788,577 A * | 11/1988 | Akiyama et al. | 355/53 |
| 5,094,536 A * | 3/1992 | MacDonald et al. | 356/514 |
| 5,563,684 A | 10/1996 | Stagaman | |
| 5,871,362 A * | 2/1999 | Campbell et al. | 439/67 |
| 6,556,281 B1 | 4/2003 | Govil et al. | |
| 6,847,433 B2 | 1/2005 | White et al. | |
| 7,046,341 B2 * | 5/2006 | Taniguchi et al. | 355/72 |
| 7,411,652 B2 * | 8/2008 | Bleeker et al. | 355/53 |

FOREIGN PATENT DOCUMENTS

| EP | 0077878 A1 | 5/1983 |
|---|---|---|
| WO | 0190820 A1 | 11/2001 |

OTHER PUBLICATIONS

Office Action for corresponding DE Application 102008052100.0-27, dated Aug. 4, 2009.

* cited by examiner

*Primary Examiner* — Hung Henry Nguyen
(74) *Attorney, Agent, or Firm* — Matthew B. Dernier, Esq.; Gibson & Dernier LLP

(57) ABSTRACT

Flexibly deformable holding elements operate such that substrates can be held in a fixed manner at a surface of the holding element electrostatically or also by use of negative pressure and planar positional deviations or unwanted deformations can be compensated simply and reliably, where at least one cut-out having an opening arranged at the rear side is formed at the rear side of the holding element which is disposed opposite the surface, and an actuator is arranged there exerting compressive forces or pulling forces for a widening or narrowing of the cut-out and/or for a deformation of the holding element.

11 Claims, 8 Drawing Sheets

FLEXIBLY DEFORMABLE HOLDING ELEMENT FOR SUBSTRATES

BACKGROUND

The invention relates to flexibly deformable holding elements for substrates. In this respect, the substrates can be held in a fixed manner at a surface of the holding element electrostatically or also by means of negative pressure. A use of the invention is in particular possible in the processing of semiconductor components or in the manufacture of micromechanical elements. In this respect, plate-shaped substrates such as preferably wafers or masks can be transported and held in a defined position with the help of the holding elements.

Electrostatic holding elements or also so-called vacuum holding elements, which are usually also called chucks, are known per se. However, the demands on the positioning precision and its observation have increased in the processing and due to miniaturization. In the meantime, electromagnetic radiation of extremely small wavelength is used for photolithographic processes, whereby these demands have been further increased.

A wafer to be processed therefore has to be held in an exact position, with this being the case, for example, with respect to masks used in a lithographic processing. Even slight spacing deviations of the substrate surface with respect to a mask have a very negative effect here which can be caused e.g. by planarity errors/planarity deviations at the respective substrate surface. The substrates in question frequently have a small thickness so that deflections occur due to manufacture. Thickness deviations or deformations can also arise due to particles which have to be taken into account. Substrates can be deflected due to uneven surfaces, which leads to distortion in the lithographic exposure. Metric errors, structural defects and ultimately defective microelectronic components can thereby be obtained which result in rejects.

As is known, sensors are used to detect such deviations. Their measured signals are also utilized to effect a direct deformation of a holding element and of a substrate held thereby. Different physical or mechanical mechanisms of action are used for this purpose.

It is thus known from WO 01/90820 A1 to form a structured piezoelectric layer at the surface of a holding element on which a carrier layer is formed on which a wafer can be placed and held as a substrate. However, an influencing of the shape of a substrate placed there can only be carried out with limitations due to the structuring at the surface of such a holding element. Deformations can occur which cause strains in the substrates or steps at the surface. The effort and/or cost for the control and the manufacture are very high.

This also applies analogously to other examples such as are known from EP 0 077 878 B1 or from U.S. Pat. No. 5,563,684. Individual adjustment elements are used there which are aligned perpendicular to the surface on which the substrate has been placed and whose lengths can each be modified individually. The surface contour of the holding element is thereby selectively changed.

SUMMARY OF THE INVENTION

It is therefore the object of the invention to provide deformable holding elements with which substrates can be held in position by means of electrostatic action of force or by negative pressure and in so doing planar positional deviations or unwanted deformations can be compensated simply and reliably.

In accordance with the invention, this object is solved by a holding element disclosed herein. Advantageous embodiments and further developments of the invention can be achieved using one or more further features disclosed and/or described herein.

A deformable holding element in accordance with the invention can be used made from a suitable material in the form of a plate with a respectively desired outer marginal geometry. The material and the thickness of the holding element only have to enable the functionality for a secure holding of a substrate and the possibility of an elastic deformation of the surface on which a substrate should be held.

At least one cut-out having an opening arranged at the rear side is formed at the rear side of the holding element disposed opposite the surface for a direct local deformation of the surface. An actuator is arranged at the one or also at further cut-outs. The actuator or actuators can exert pressure and/or pulling forces in the region of the cut-out which result in a widening or narrowing of the respective cut-out. In an embodiment of the invention, a deformation of the holding element can be achieved in which the actuator or actuators act at the rear side of the holding element or at a spacing from the neutral fiber of the holding element which is aligned largely parallel to the surface or to the rear side of the holding element. For a widening or narrowing of cut-outs, their rear-side opening is made larger or smaller. Possible examples of how this can specifically be achieved will be looked at in more detail later.

In the invention, the vectors of the forces applied by actuators should be aligned parallel to the surface and/or to the rear side, but at least almost parallel thereto.

A deformation of a holding element can, however, also be achieved if an actuator engages simultaneously at at least two cut-outs arranged at a spacing from one another and then pulls them together or presses them apart. Such an actuator so-to-say forms a clamp for two cut-outs at which it engages. If more than two cut-outs are influenced with one actuator, it can, for example, have a corresponding number of mutually connected lever arms whose effective lengths can each be changed individually.

Cut-outs can also be called depressions or cavities. They can have different designs and dimensions. Blind holes or slits (trenches) are thus particularly suitable shapes for cut-outs. They should have a constant free cross-section, e.g. a constant inner diameter or slit width, over a larger region and should, where possible, not be made conical or should be made only very slightly conical.

The surface of the holding element can be influenced directly with the invention. It can be completely or partly arched if this is desired. This is possible in both a concave and a convex manner depending on which force action is exerted on the rear side with at least one actuator. Active pulling forces, for instance, as a rule result in a convex deformation of the surface and compressive forces in a concave deformation of the surface.

If a plurality of cut-outs are formed in a corresponding arrangement at one holding element and are provided with actuators, the thereby achievable deformation to a three-dimensionally curved surface of the holding element, which also does not have to be rotationally symmetrical around a point, can be achieved.

Cut-outs can also be present at a holding element which are not directly influenced by an actuator to be able to have a positive influence on the deformability and bending strength.

If a substrate should be held by means of a negative pressure effect using a holding element in accordance with the invention, at least one negative pressure channel can also be used as a cut-out for a force engagement by actuators.

Different actuators can be used in the invention with which compressive forces or drawing forces can be exerted. They can be elements acting purely mechanically with which, for example, forces result in a force exertion via a change of the length between two points at which such an element is fastened to a holding element. This can be achieved manually, but also using a suitable motor drive. Piezoelectric elements, thermomechanical elements, magnetorestrictive, hydraulically or pneumatically acting elements can, however, also be used. With thermomechanical elements, different thermal coefficients of expansion of different materials are utilized in conjunction with a temperature control.

A unidirectional force effect can be utilized with correspondingly formed actuators and with matching to the respective cut-out, preferably with cut-outs made as slits. With blind holes, which are to be widened or narrowed, actuators are to be preferred which can exert a radial force effect.

The connection of actuators to a holding element can be achieved solely by shape matching, but preferably with material continuity. Connections having material continuity can be formed by adhesion, soldering, welding or as a bond connection suitable for the materials used.

The manufacture, of holding elements in accordance with the invention can take place such that the rear side is machined first and one or more cut-outs are formed in this process. Depending on the holding element material and on the respective size of a holding element, in particular on the size of the surface and of its thickness, this can be done purely mechanically, but also chemically by a suitable etching technique. The surface carrying the substrates can then be machined before or after the fastening of actuators. Deformations which may have arisen on the machining of the rear side can thereby be taken into account and can be compensated at the surface.

If cut-outs are formed in a grid or in an array arrangement at the rear side, the most varied deformations can be achieved at a holding element since e.g. no forces or different forces can act locally directly at cut-outs. In this respect, cut-outs can also be designed and/or dimensioned differently at a rear side of a holding element, which represent, in addition to the respective position of a cut-out, likewise influenceable parameters for an achievable deformation of a holding element at its surface. The respective position of the force engagement point or points of actuators also plays/play a role, however. They can lie at the surface of a rear side of a holding element when an actuator is connected to the holding element with material continuity there or when the forces exerted by it engage there. Force engagement points of actuators should preferably be arranged in proximity to the rear side and in this respect as close as possible to the rear side and as far as possible from the neutral fiber or center plane of a holding element in order to be able to utilize large levers for a deformation of a holding element.

Long/deep blind holes with small inner diameters or narrow deep slits can thus, for example, effect a spatially limited deformation at a holding element than shorter cut-outs/cut-outs which are not so deep with larger inner diameters or wider, less deep slits.

The respective required forces which should act at one or more cut-outs to achieve a specific desired deformation at a holding element can be determined in advance by a finite element calculation (FEM). They can be calculated and optimized in advance. As already addressed, the required forces can then be utilized for the influencing of actuators while taking account of positioning signals determined using sensors and the values calculated.

Blind holes as a possible form of cut-outs should preferably be dimensioned so that their inner diameters lie in the range of 0.25 times up to 0.75 times the thickness of the respective holding element. The depth should maximally reach up to the neutral fiber or to the center plane of the holding element. Inner diameters and depths of blind holes are particularly preferably to be selected so that they correspond to approximately ⅓ of the thickness (spacing between surface and rear side) of the respective holding element.

Slits as cut-outs should have a slit width which preferably lies in the range of 0.1 times up to 0.5 times the thickness of a holding element, preferably corresponds to 0.2, times up to 0.5 times the thickness. These indications also apply to the depth of slits. In this respect, the depth is to be understood as the spacing of a cut-out, starting from the rear side, up to the base of the respective cut-out.

In particular on the carrying out of cut-outs in the form of slits with a straight-line longitudinal axis, unidirectional forces can act at them with actuators. They can cause a cylindrical shape change of a holding element. With slits, there is, however, also the possibility of displacing actuators along the longitudinal axis of a slit; the position of force engagement points of an actuator can thereby be changed and a desired deformation of a holding element can thus also be influenced. This is also possible with slits made curved.

Shape defects and disturbing deflections of the surface of holding elements or also substrates can be compensated in full, but at least to a considerable extent, using the invention. This also applies to the compensation of thickness deviations of substrates. In this respect, deviations which can occur due to positional changes or temperature changes during a processing can also be taken into account. This can take place in regulated or controlled form.

BRIEF DESCRIPTION OF THE DRAWINGS

The invention should be explained in more detail in the following with reference to examples.

There are shown.

DETAILED DESCRIPTION OF THE INVENTION

The action and the mechanism utilized in accordance with the invention should be illustrated by FIGS. 1a to 1d.

Figure 1A:
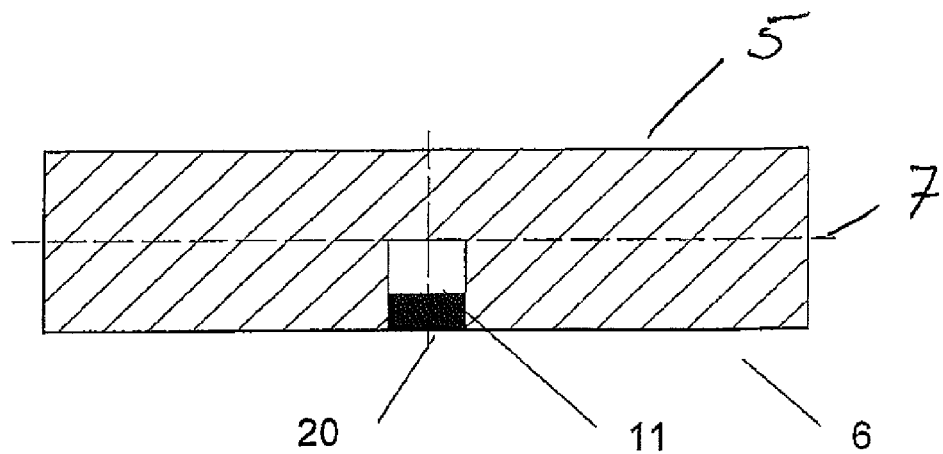
FIGS. 1a to 1d in schematic form, arrangements of cut-outs at a holding element with the mechanism of action.

In this respect, sectional representations through a plate-shaped holding element 1 have been selected. In FIG. 1a, a blind hole is formed at the rear side 6 of a holding element 1 as a cut-out 11 which has its opening at the rear side 6. Since a homogenous material and a corresponding geometry have been selected for the holding element 1, the neutral fiber 7 lies in the center plane of the holding element between its surface 5 and the rear side 6. It has a depth which reaches up to the neutral fiber 7, that is, which corresponds to half the thickness of the holding element 1. The inner diameter is the same size as the depth. The base of the blind hole does not necessarily have to be made as a planar surface, as shown here.

An actuator 20 is inserted into the opening of the cut-out 11 and its force engagement points are arranged just below the edge at the rear side 6 in the interior of the cut-out 11. The cut-out is not completely filled by the actuator 20.

Figure 1B:
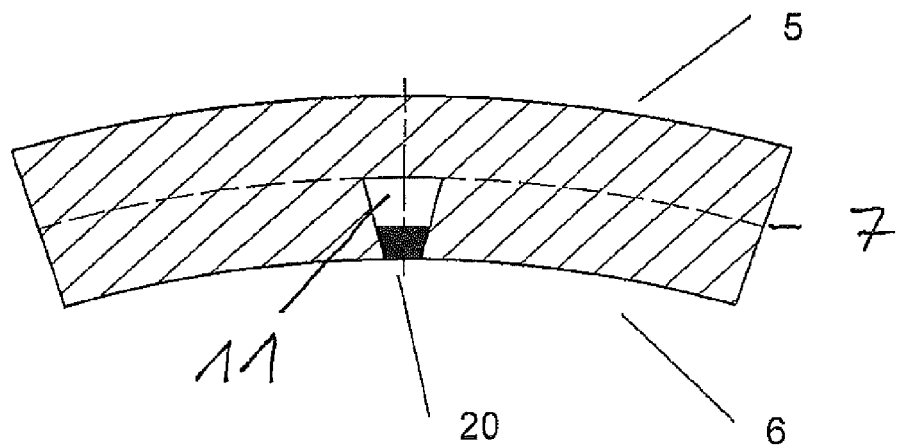
Figure 1C:
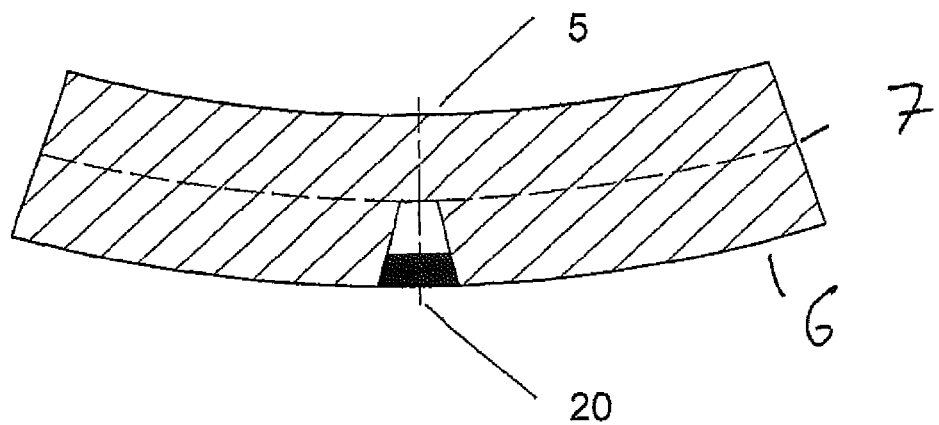

A deformation of the holding element 1 with active pulling forces is shown in FIG. 1b. The surface 5 is thus deformed convexly by narrowing of the cut-out in the region of the opening of the cut-out. In the illustration in accordance with FIG. 1c, compressive forces of the actuator 20 act so that the opening of the cut-out 11 is widened and the surface 5 of the holding element 1 is concavely deformed.

Figure 1D:
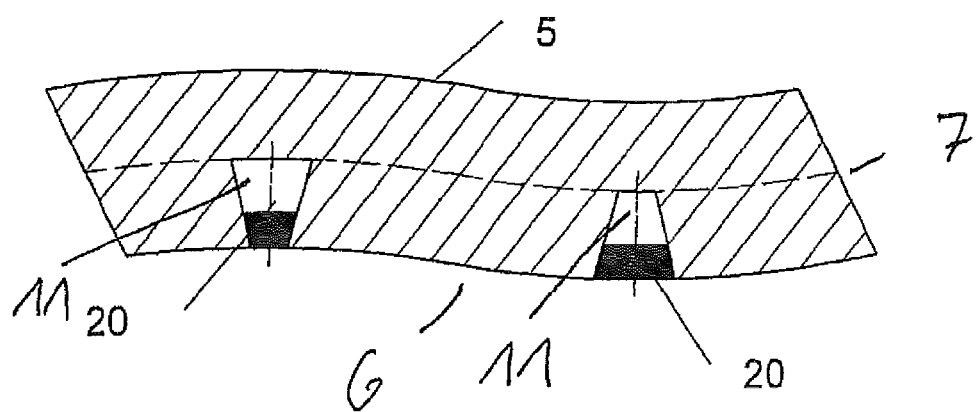

A combination of these deformations at a holding element 1 is shown by FIG. 1d. In this respect, pulling forces act on the cut-out 11 shown at the left here and compressive forces simultaneously act on the cut-out 11 shown at the right. The surface 5 can thereby be deformed in wave shape.

In an embodiment not shown here, however, an actuator 20 could also engage into the two cut-outs which is made similar to a clamp and has three limbs. Two of the limbs can be introduced into the cut-outs 11 and the middle limb disposed therebetween and connecting the two other limbs can be changeable in length. If its length is shortened, the surface 5 can be deformed convexly and if lengthened concavely. This can e.g. be achieved by means of a power drive, a hydraulic drive, a pneumatic drive or piezoelectrically at this limb.

Figure 2:
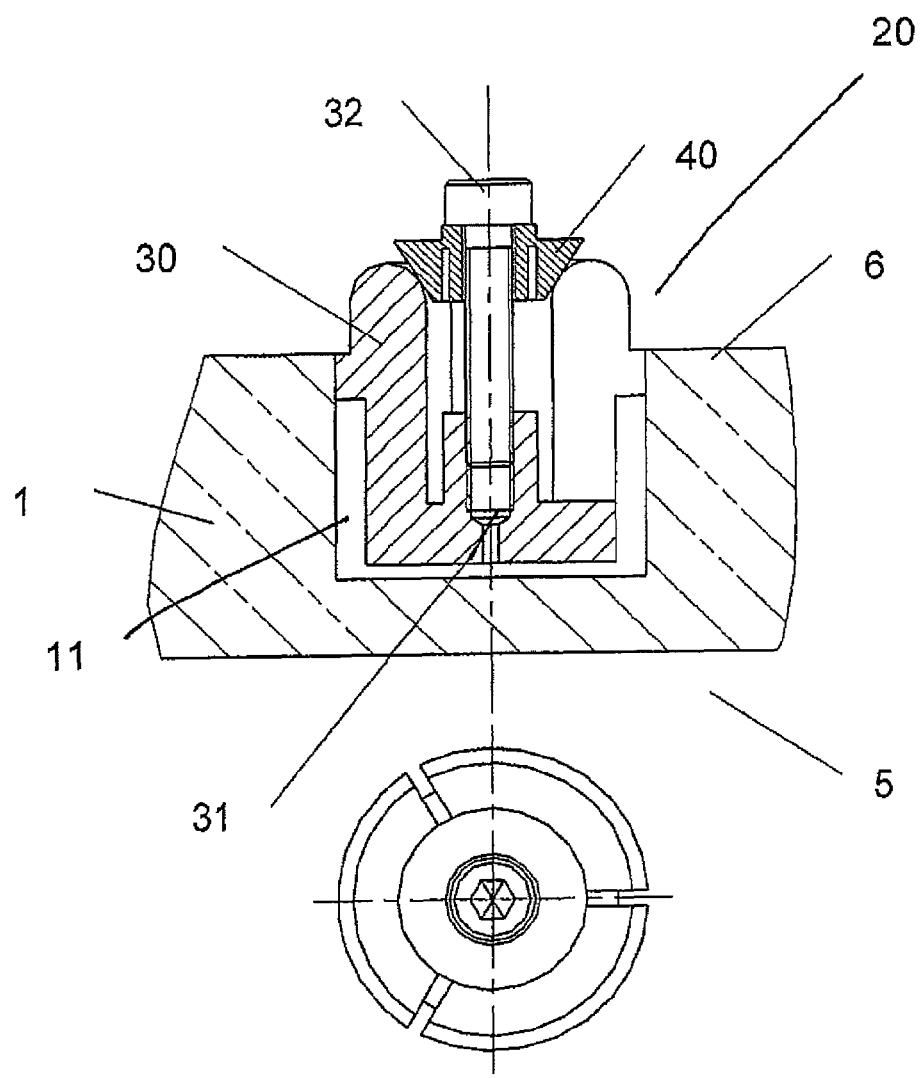
FIG. 2 a partially sectional representation of a cut-out with actuator for an example of a holding element in accordance with the invention.

In the part section of a holding element shown in FIG. 2, a mechanical element is inserted into a cut-out 11, preferably for the exertion of radial compressive forces, as an actuator 20. It has a sleeve 30 which is flexibly deformable and is provided radially outwardly with slits, as is visible in the plan view shown at the bottom. A radially peripheral yoke or web is formed in the upper region of the sleeve 30. Said yoke or web contacts the inner wall of the cut-out 11, here a blind hole, in the region directly below the edge of the cut-out 11 formed by the rear side 6. In the base region of the sleeve 30, an internal thread 31 is formed into which a screw 32 is guided which in turn biases a conically formed elastic insert element 40 against an upper marginal region in the interior of the sleeve. On a rotation of the screw 32, the bias of the insert element 40 acting on the sleeve 30 can be increased. Compressive forces acting on the upper inner margin of the cut-out 11 are thereby exerted or increased. The rear-side opening of the cut-out 11 is thereby widened and the holding element 1 is concavely deformed in this region at the surface 5 arranged at the bottom here.

The screw 32 can, as also in the examples described in the following, be rotated manually, but also by means of a motor drive (not shown).

Forces can be exerted onto the holding element 1 in a defined manner by the elastic design of the sleeve 30 and of the insert element 40, said forces resulting in a defined local deformation of the holding element 1 due to the geometric arrangement of the cut-out 11 and to the arrangement of the force engagement points there. Since the material of the holding element is also flexible, the deformation can also be taken back again by this elasticity and a starting shape can again be achieved.

If the sleeve 30 is connected to the holding element 1 with material continuity in the cut-out 11—this should only be the case in the region of the force engagement points, that is, at the yoke/web—pulling forces can also be exerted using an actuator 20 formed in this way which can result in an opposed deformation of a holding element 1.

However, also with a formation of cut-outs 11 as blind holes, a piezoelectric ring actuator such as can be obtained from PI Ceramic GmbH, domiciled in Lilienstrasse, Lederhose, Germany, be used as the actuator 20. A suitable stacked piezoactuator can likewise be obtained from this company for the application of unidirectional forces.

Figure 3:
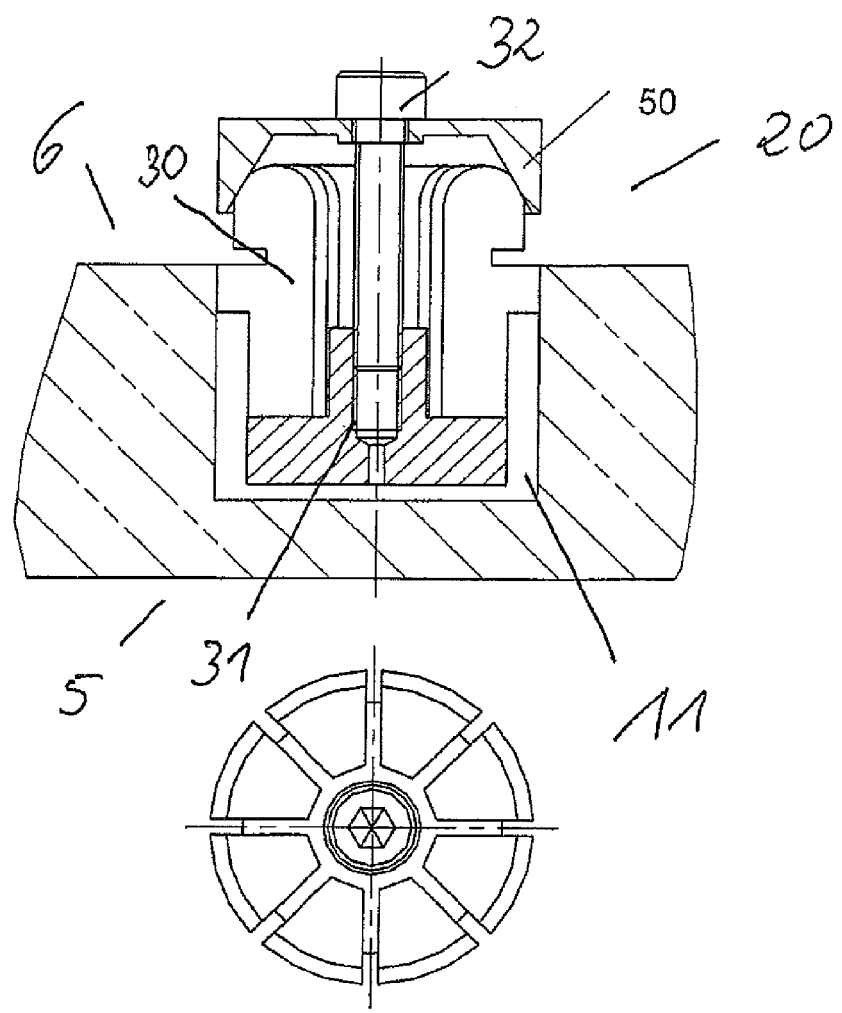
FIG. 3 a partially sectional representation of a cut-out with actuator for a further example of a holding element in accordance with the invention.

An example as a partially sectional representation should be illustrated by FIG. 3 in which a mechanical element is inserted as an actuator 20 into a cut-out 11 made as a blind hole and with which pulling forces should be exerted to narrow the opening of the cut-out and thereby to deform the surface 5 convexly.

A sleeve 30 is likewise present at the mechanical element and is here slit six-fold in the outer jacket region to achieve a flexible deformability. The sleeve 30 is likewise connected with material continuity in the marginal region at the edge of the rear side 6 of the holding element 1 within the cut-out. An internal thread 31 is also present in a base region of the sleeve 30 here and a screw 32 is introduced into it. An elastic insert element 50 is placed onto the outwardly facing side of the sleeve 30 and can be tensioned toward the outer edge of the sleeve using the screw 32. A peripheral inner cone is formed at the insert element 50 and acts on the outer marginal region of the sleeve 30. If the bias is increased by turning the screw 32, the outer margin of the sleeve 30 is compressed inwardly and pulling forces act radially which result in a narrowing of the opening of the cut-out 11 and thereby in a corresponding deformation of the holding element 1.

Figure 4:
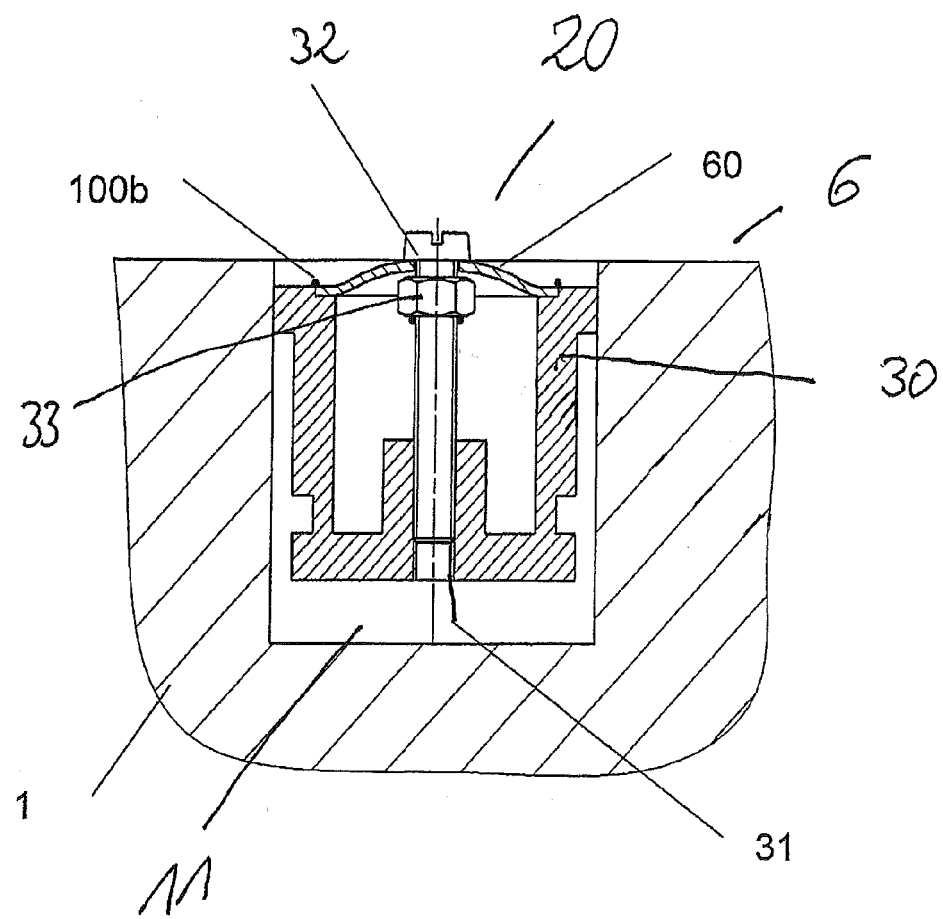
FIG. 4 a partially sectional representation of a cut-out with actuator for a further example of a holding element in accordance with the invention.

A partial section is shown in FIG. 4 for an example having a mechanical actuator 20 with which pulling forces and compressive forces can be utilized radially. Analog to the examples in accordance with FIGS. 2 and 3, a sleeve 30 is inserted into a cut-out 11 made as a blind hole and is connected with material continuity there to the holding element 1. An internal thread 31 with an introduced screw 32 is again present in the base region of the sleeve 30. A membrane spring 60 is supported at the outer margin of the sleeve 30 and is held in a shape matched manner and/or with material continuity at the outer margin. A shape matched connection can be achieved using a peripheral margin at the sleeve 30 there in connection with the radially outer end-face margin of the membrane spring 60 which can contact this margin. A weld connection can, however, also be established additionally or solely there.

A check nut 33 or another fixing element is fastened rigidly, for example by welding, to the screw 32. The membrane spring 60 is supported thereon in the direction of the interior of the sleeve 30. If the screw 32 is now rotated, the membrane spring 60 moves parallel to the longitudinal axis of the screw 32 and pulling forces or compressive forces act on the outer margin of the sleeve 30, where the radially outer margin of the membrane spring 60 contacts and is optionally connected there with material continuity to the sleeve 30.

Figure 5:
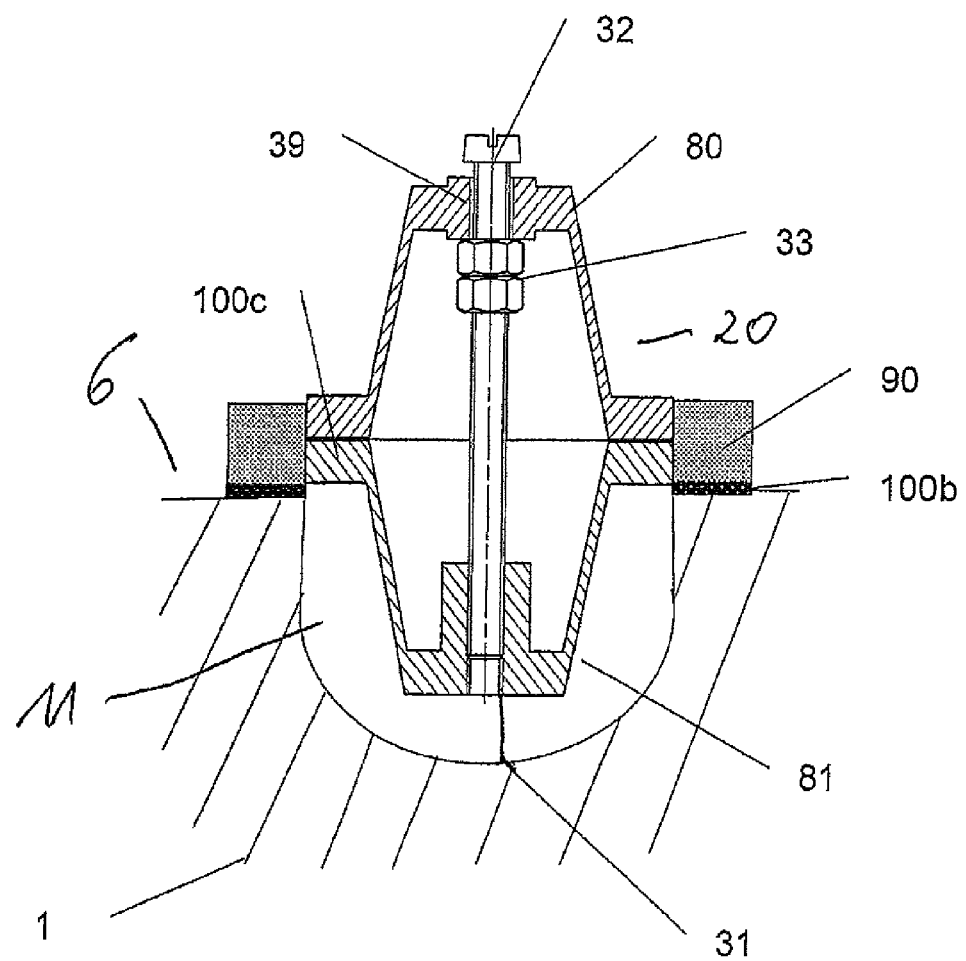
FIG. 5 a partially sectional representation of a cut-out with actuator for a further example of a holding element in accordance with the invention.

In the example likewise shown in partial section in FIG. 5, compressive forces and pulling forces are likewise applied mechanically. A cut-out 11 is also made as a blind hole here. A ring-shaped element 90 is connected to the holding element 1 by a weld connection 100b with material continuity at the rear side 6 of the holding element 1 and surrounds the outer margin of the rear side opening of the cut-out 11. The mechanically acting element is formed as the actuator 20 with two ceramic or metallic sleeve elements 80 and 80 which are e.g. connected to one another by a weld connection 100c with material continuity. In this example, the two sleeve elements 80 and 81 are made almost the same in geometry and dimensioning. An internal thread 31 into which the screw 32 is introduced is likewise formed at the sleeve element 81 which is arranged in the interior of the cut-out 11. An aperture 39 through which the screw 32 is guided in a clearance fit is present in the outer end wall region of the outer sleeve element 80. In this respect, the screw head is supported at the outer end margin of the outer sleeve element 80. Two check nuts 33 are fastened to the screw 32 here. This fixing can, however, also be achieved differently with an element rigidly fastened to the screw 32 there. Both sleeve elements 80 and 81 are connected with material continuity to the ring-shaped element 90.

If the screw 32 is now rotated and the two sleeve elements 80 and 81 are thereby pressed together by the mutually contacting end faces 100c, which are welded to one another, compressive forces from their radially outer margins act on the ring-shaped element 90 and are transferred to the rear side 6 of the holding element 1. A widening of the opening of the cut-out 11 is thereby effected which in turn results in a concave deformation of the surface 5.

If the screw 32 is, in contrast, rotated in the other direction, the two sleeve elements 80 and 81 are pulled apart so that pulling forces from them act on the ring-shaped element 90 and are transmitted to the rear side 6 of the holding element 1 so that a narrowing of the opening of the cut-out can be achieved with a convex deformation of the surface 5 of the holding element 1 in this region.

Figure 6:
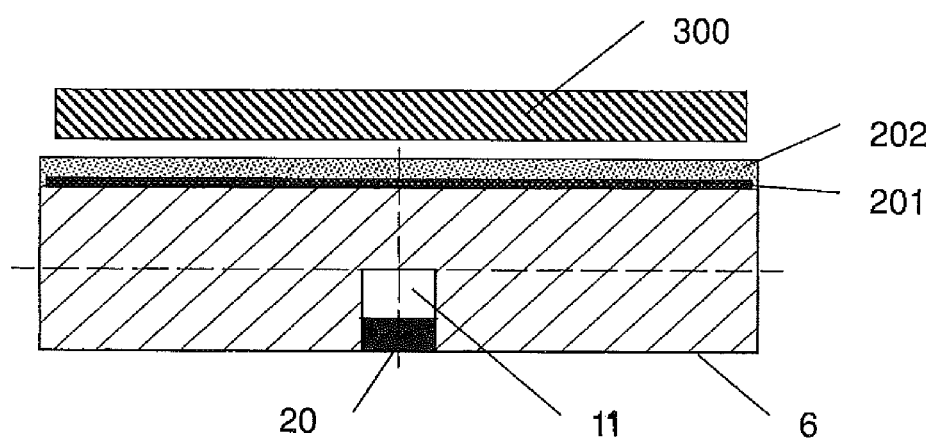
FIG. 6 in schematic form, illustrates an arrangement of a holding element including an electrostatic mechanism and a substrate.
Figure 7:
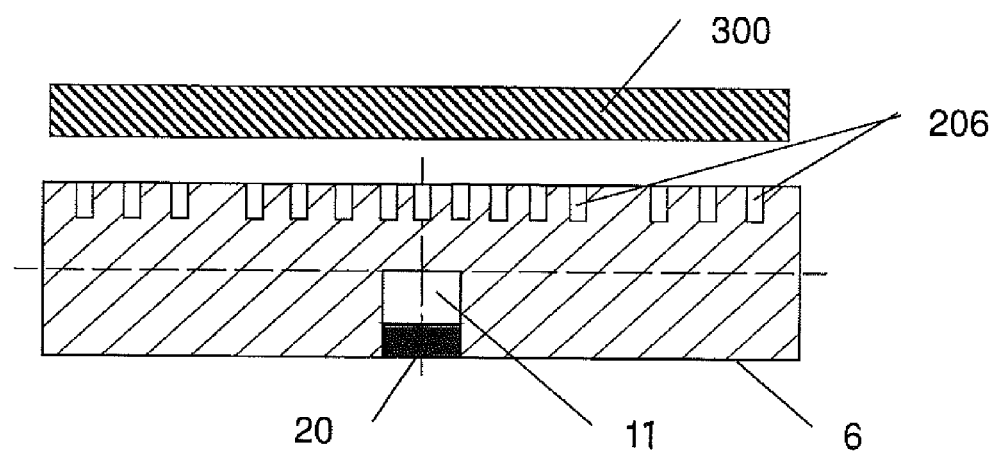
FIG. 7 in schematic form, illustrates an arrangement of a holding element including a number of cut-outs to facilitate bending of the holding element.

FIG. 6 illustrates in schematic form an arrangement of the holding element 1, which includes an electrostatic mechanism formed of an electrode layer 201 and a dielectric layer 202 disposed on the surface 5. The electrostatic mechanism holds the substrate 300 to the holding element. FIG. 7 illustrates in schematic form that the holding element 1 may include a number of cut-outs 206 to facilitate bending of the holding element 1.

The invention claimed is:

1. An apparatus, comprising:
 a flexibly deformable holding element for holding substrates, the flexibly deformable holding element including front and rear spaced-apart and opposite surfaces,
 means for holding the substrate being located at the front surface of the flexibly deformable holding element, which holds the substrate one of electrostatically and by means of negative pressure,
 at least one cut-out disposed in the flexibly deformable holding element and having an opening arranged at the rear surface, and
 an actuator disposed in the at least one cut-out and operating to exert at least one of compressive forces and pulling forces for widening or narrowing of the cut-out, and for deforming the flexibly deformable holding element.

2. The apparatus in accordance with claim 1, wherein the cut-out is formed as a blind hole or a slit.

3. The apparatus in accordance with claim 1, wherein the actuator is one of: a mechanical element, a piezoelectric element, a thermomechanical element, a magnetically, magnetorestrictive, hydraulically and a pneumatically acting element.

4. The apparatus in accordance with claim 1, wherein the holding element and the actuator are connected to one another with material continuity.

5. The apparatus in accordance with claim 1, wherein the actuator engages at least two cut-outs arranged spaced apart from one another.

6. The apparatus in accordance with claim 1, wherein the at least one of compressive forces and pulling forces takes place at one of: the rear surface of the holding element and an inner wall of the at least one cut-out.

7. The apparatus in accordance with claim 1, wherein a plurality of the cut-outs are arranged in at least one of a grid and two slits arranged in parallel at a spacing from one another.

8. The apparatus in accordance with claim 1, wherein a diameter of blind holes operating as the cut-out lies in the range of 0.25 times up to 0.75 times a thickness of the holding element; and the cut-outs made as slits have a slit width which is kept in the range of 0.1 times up to 0.5 times the thickness of the holding element and the cut-outs have a maximum depth which reaches up to a neutral fiber of the holding element.

9. The apparatus in accordance with claim 1, wherein force vectors resulting from the at least one of compressive forces and pulling forces by the actuator are aligned parallel to the rear surface of the holding element.

10. The apparatus in accordance with claim 1, wherein the actuator is arranged at the cut-out formed as a slit displaceably along a longitudinal axis of the slit.

11. The apparatus in accordance with claim 1, wherein additional cut-outs are formed without an associated actuator at the holding element.

* * * * *